United States Patent
Liu

(10) Patent No.: US 10,168,355 B2
(45) Date of Patent: Jan. 1, 2019

(54) RADIO FREQUENCY TEST SOCKET AND RADIO FREQUENCY TEST CABLE

(71) Applicant: ZTE CORPORATION, Guangdong (CN)

(72) Inventor: Fengyu Liu, Guangdong (CN)

(73) Assignee: ZTE CORPORATION, Shenzhen (CN)

( * ) Notice: Subject to any disclaimer, the term of this patent is extended or adjusted under 35 U.S.C. 154(b) by 72 days.

(21) Appl. No.: 15/307,307

(22) PCT Filed: Sep. 17, 2014

(86) PCT No.: PCT/CN2014/086763
§ 371 (c)(1),
(2) Date: Oct. 27, 2016

(87) PCT Pub. No.: WO2015/165194
PCT Pub. Date: Nov. 5, 2015

(65) Prior Publication Data
US 2017/0045549 A1    Feb. 16, 2017

(30) Foreign Application Priority Data

Apr. 30, 2014  (CN) .......................... 2014 1 0180990

(51) Int. Cl.
*G01R 1/04*      (2006.01)
*H04M 1/24*      (2006.01)
(Continued)

(52) U.S. Cl.
CPC .......... *G01R 1/045* (2013.01); *G01R 31/021* (2013.01); *G01R 31/44* (2013.01);
(Continued)

(58) Field of Classification Search
None
See application file for complete search history.

(56) References Cited

U.S. PATENT DOCUMENTS 9,857,392 B2 * 1/2018 McTigue ............ G01R 1/06788
2006/0139217 A1 * 6/2006 Vance .................. G01R 1/0408
343/702

(Continued)

FOREIGN PATENT DOCUMENTS

| CN | 1566970 A | 1/2005 |
|---|---|---|
| CN | 101258648 A | 9/2008 |
| CN | 102142856 A | 8/2011 |

OTHER PUBLICATIONS

International Search Report for Application No. PCT/CN2014/086763, dated Feb. 6, 2015.

*Primary Examiner* — Patrick Assouad
*Assistant Examiner* — Demetrius R Pretlow
(74) *Attorney, Agent, or Firm* — Marshall, Gerstein & Borun LLP

(57) ABSTRACT

The present disclosure discloses a radio frequency test socket, a radio frequency test cable and relates to RF test. The RF test method includes: connecting a first test apparatus to a second test apparatus via a first and second elastic apparatuses in a radio frequency test socket, the first and second elastic apparatuses are connected to the first and second test apparatuses; disconnecting the radio frequency test socket from the second test apparatus by urging an insulated push pin apparatus against the second elastic apparatus, so that the first test apparatus is tested via a radio frequency test plug and the first elastic apparatus; disconnecting the radio frequency test socket from the first test apparatus by urging the insulated push pin apparatus against the first elastic apparatus, so that the second test apparatus is tested via the radio frequency test plug and the second elastic apparatus.

7 Claims, 3 Drawing Sheets

(51) Int. Cl.
*G01R 31/02* (2006.01)
*H01R 13/703* (2006.01)
*G01R 31/44* (2006.01)
*H01R 24/46* (2011.01)

(52) U.S. Cl.
CPC ..... *H01R 13/7031* (2013.01); *H01R 13/7036* (2013.01); *H04M 1/24* (2013.01); *H01R 24/46* (2013.01); *H01R 2201/02* (2013.01); *H01R 2201/20* (2013.01)

(56) References Cited

U.S. PATENT DOCUMENTS

| | | | | |
|---|---|---|---|---|
| 2010/0295569 | A1* | 11/2010 | Chu | G01R 31/2822 324/750.01 |
| 2011/0301905 | A1* | 12/2011 | Gregg | G01R 35/005 702/106 |
| 2012/0262188 | A1* | 10/2012 | Nickel | G01R 1/06772 324/629 |
| 2012/0287792 | A1* | 11/2012 | Nickel | G01R 1/06772 370/241 |
| 2012/0319697 | A1* | 12/2012 | Gregg | G01R 31/2822 324/511 |
| 2013/0044033 | A1* | 2/2013 | Nickel | G01R 29/10 343/703 |
| 2015/0160264 | A1* | 6/2015 | Rada | G01R 31/2822 324/754.21 |

* cited by examiner

RADIO FREQUENCY TEST SOCKET AND RADIO FREQUENCY TEST CABLE

TECHNICAL FIELD

The present disclosure relates to the technical field of radio frequency tests for a terminal and in particular relates to a radio frequency test socket and a radio frequency test cable.

BACKGROUND

Currently used radio frequency test sockets are mainly used for testing power and sensitivity of a radio frequency cable. When no radio frequency test cable is inserted, a signal can flow in a bidirectional manner, as shown in FIG. 1, a line with an arrowhead is a signal line, and a direction of the arrowhead represents a flow direction of the signal. However, when the radio frequency test cable is inserted, the signal can only be conducted in a one-way manner. Schematic diagrams of a radio frequency test socket and a radio frequency test cable are respectively shown in FIG. 2 and FIG. 3. As shown in FIG. 4, in a scene of testing the power of the radio frequency cable, when the radio frequency test cable is connected to the radio frequency test socket, the radio frequency test socket is conducted in the one-way manner, i.e., is only conducted with a radio frequency chip on one side and is disconnected from an antenna on the other side. That is to say, when no radio frequency test cable is inserted, a spring strip in the radio frequency test socket is in a state shown by a dotted line in the figure. When the radio frequency test cable is inserted, the spring strip in the radio frequency test socket is extruded from the dotted line state downwards to a solid line state.

That is, a radio frequency test socket is arranged between each radio frequency chip and an antenna on a Long Term Evolution (LTE) terminal. After the radio frequency test cable is inserted onto the existing radio frequency test socket, only one-way conduction is realized, and if a Smith circle diagram or a parameter S11 of the antenna needs to be measured, it is necessary to remove the radio frequency test socket, and weld the radio frequency test cable onto a mainboard. Thus, there exists the following defects:

1. It is necessary to damage a mainboard to manufacture a passive jig for testing the antenna;

2. A certain difference usually exists between a passive board and an active board, thus stationary waves for the antenna modulated on the passive board often cannot correspond to antenna performance tested by the active board respectively;

3. The passive board needs to be remanufactured if mainboard radio frequency matching or a mainboard manufacturer is replaced, which needs to damage many mainboards.

In order to solve the above problems, the embodiments of the present disclosure provide a radio frequency test socket and a radio frequency test cable.

SUMMARY

The embodiments of the present disclosure provide a radio frequency test socket and a radio frequency test cable for at least solving the problem in related art, so that an antenna passive board and a radio frequency active board may be unified when an antenna jig is manufactured without damaging a mainboard.

According to an embodiment of the present disclosure, a radio frequency test socket is provided, including:
a radio frequency test base;
a connection apparatus fixed in the radio frequency test base; and
a first elastic apparatus and a second elastic apparatus which are fixed in the radio frequency test base, and elastically connected to the connection apparatus respectively.

The connection apparatus includes:
a metal sheet;
a first contact point and a second contact point which are provided at two ends of a lower side of the metal sheet.

The first elastic apparatus is elastically connected to the first contact point of the connection apparatus, and the second elastic apparatus is elastically connected to the second contact point of the connection apparatus.

According to another embodiment of the present disclosure, a radio frequency test cable is provided, including:
a radio frequency test plug fixed at an end of the radio frequency test cable;
an insulated push pin apparatus which is installed on a side of the radio frequency test plug and is longer than the radio frequency test plug.

According to another embodiment of the present disclosure, a device for mobile phone radio frequency test is provided, including:
the above radio frequency test socket;
the above radio frequency test cable; and
a test module, configured to test, through the radio frequency test cable and the radio frequency test socket, a first test apparatus and a second test apparatus respectively, the first test apparatus and the second test apparatus are connected to the first elastic apparatus and the second elastic apparatus in the radio frequency test socket respectively.

The test module includes:
a first test submodule, configured to disconnect the radio frequency test cable from the second test apparatus by urging the insulated push pin apparatus against the second elastic apparatus, and utilize a connection between the radio frequency test plug and the connecting apparatus, so as to test the first test apparatus connected to the first elastic apparatus.

The test module further includes:
a second test submodule, configured to disconnect the radio frequency test cable from the first test apparatus by urging the insulated push pin apparatus against the first elastic apparatus, and utilize a connection between the radio frequency test plug and the connection apparatus, so as to test the second test apparatus connected to the second elastic apparatus.

An elastic connection between the second elastic apparatus and the second contact point of the connection apparatus is disconnected when urging the insulated push pin apparatus against the second elastic apparatus, so that the radio frequency test cable is disconnected from the second test apparatus.

An elastic connection between the first elastic apparatus and the first contact point of the connection apparatus is disconnected when urging the insulated push pin apparatus against the first elastic apparatus, so that the radio frequency test cable is disconnected from the first test apparatus.

According to another embodiment of the present disclosure, a method for mobile phone radio frequency test is provided, including the following steps:
connecting a first test apparatus to a second test apparatus via a first elastic apparatus in a radio frequency test socket and a second elastic apparatus in the radio frequency test socket, the first elastic apparatus is connected to the first test apparatus and the second elastic apparatus is connected to the second test apparatus;

disconnecting the radio frequency test socket from the second test apparatus by urging an insulated push pin apparatus of a radio frequency test cable against the second elastic apparatus, so that the first test apparatus is tested via a radio frequency test plug of the radio frequency test cable and the first elastic apparatus; and disconnecting the radio frequency test socket from the first test apparatus by urging the insulated push pin apparatus of the radio frequency test cable against the first elastic apparatus, so that the second test apparatus is tested via the radio frequency test plug of the radio frequency test cable and the second elastic apparatus.

Compared with the related art, the embodiments of the present disclosure have the following beneficial effects:

according to the embodiments of the present disclosure, through the radio frequency test socket and the radio frequency test cable, a first test unit and a second test unit may be unified, the antenna jig can be manufactured without damaging the mainboard, and user experience is improved.

DETAILED DESCRIPTION

The preferred embodiments of the present disclosure are described in details below by combining with the drawings. It should be understood that, the preferred embodiments described below are only used for describing and illustrating the present disclosure, but not be used for limiting the present disclosure.

Figure 1:
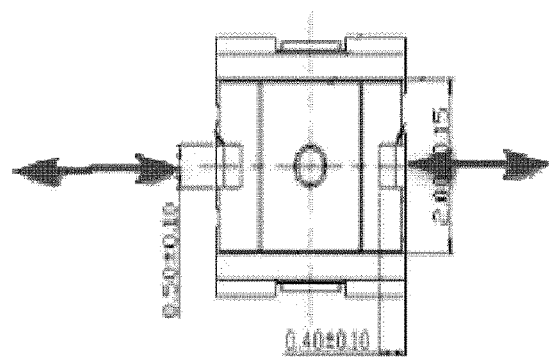
FIG. 1 is a bottom view showing a radio frequency test socket provided by the related art.
Figure 2:
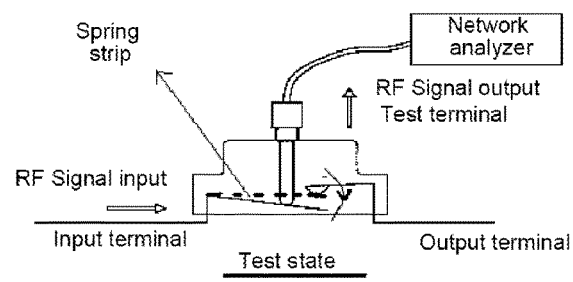
FIG. 2 is a schematic diagram showing a radio frequency test socket provided by the related art.
Figure 3:
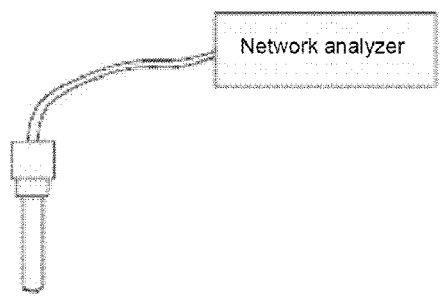
FIG. 3 is a schematic diagram showing a radio frequency test cable provided by the related art.
Figure 4:
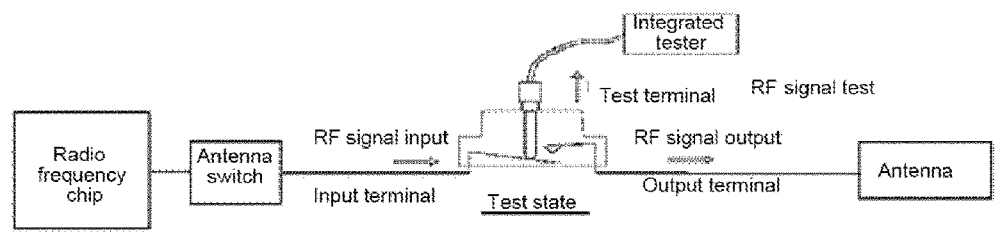
FIG. 4 is a structure diagram showing operations of a radio frequency test socket and a radio frequency test cable provided by the related art.
Figure 5:
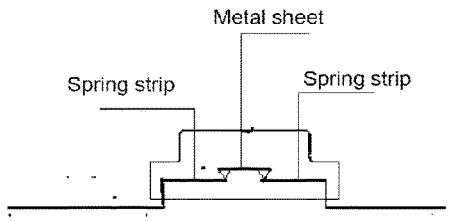
FIG. 5 is a schematic diagram showing a radio frequency test socket provided by the present disclosure.

FIG. 5 is a schematic diagram showing a radio frequency test socket provided by the present disclosure. As shown in FIG. 5, the radio frequency test socket includes: a radio frequency test base; a connection apparatus fixed in the radio frequency test base, configured to be connected to a radio frequency test cable; a first elastic apparatus and a second elastic apparatus which are fixed in the radio frequency test base and elastically connected to the connection apparatus respectively, the first elastic apparatus and the second elastic apparatus are configured to connect/disconnect the radio frequency test cable and a first test apparatus/a second test apparatus. The connection apparatus includes: a metal sheet; a first contact point and a second contact point which are provided at two ends of a lower side of the metal sheet. The first elastic apparatus is elastically connected to the first contact point of the connection apparatus, and the second elastic apparatus is elastically connected to the second contact point of the connection apparatus.

Figure 6:
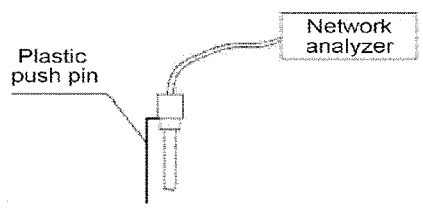
FIG. 6 is a schematic diagram showing a radio frequency test cable provided by the present disclosure.

FIG. 6 is a schematic diagram showing a radio frequency test cable provided by the present disclosure. As shown in FIG. 6, the radio frequency test cable includes: a radio frequency test plug fixed at an end of the radio frequency test cable, configured to be connected to the connection apparatus of the radio frequency test socket; an insulated push pin apparatus, which is installed on a side of the radio frequency test plug and is longer than the radio frequency test plug, the insulated push pin apparatus is configured to be urged against the first elastic apparatus or the second elastic apparatus in the radio frequency test socket.

Figure 7:
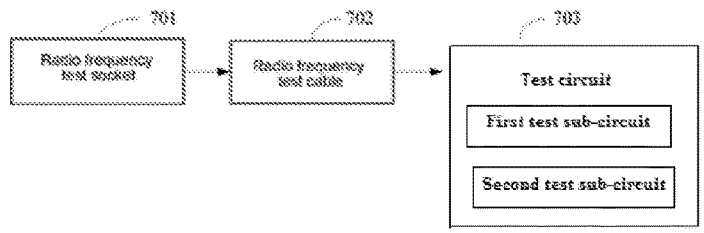
FIG. 7 is a schematic diagram showing an apparatus for mobile phone radio frequency test provided by embodiments of the present disclosure.

FIG. 7 is a schematic diagram showing an apparatus for mobile phone radio frequency test provided by the embodiments of the present disclosure. As shown in FIG. 7, the apparatus for mobile phone radio frequency test includes: the above radio frequency test socket 701; the above radio frequency test cable 702; a test module 703, configured to test, with the radio frequency test cable and the radio frequency test socket, a first test apparatus and a second test apparatus, the first test apparatus and the second test apparatus are connected to the first elastic apparatus and the second elastic apparatus in the radio frequency test socket respectively. Specifically, the test module 703 includes a first test submodule and a second test submodule. The first test submodule is configured to disconnect the radio frequency test cable from the second test apparatus by urging the insulated push pin apparatus against the second elastic apparatus, and utilize a connection between the radio frequency test plug and the connection apparatus, so as to test the first test apparatus connected to the first elastic apparatus. Specifically, an elastic connection between the second elastic apparatus and the second contact point of the connection apparatus is disconnected when urging the insulated push pin apparatus against the second elastic apparatus, so that the radio frequency test cable is disconnected from the second test apparatus. The second test submodule is configured to disconnect the radio frequency test cable from the first test apparatus by urging the push pin apparatus against the first elastic apparatus, and utilize a connection between the connection apparatus and the radio frequency test plug, so as to test the second test apparatus connected to the second elastic apparatus. Specifically, an elastic connection between the first elastic apparatus and the first contact point of the connection apparatus is disconnected when urging the insulated push pin apparatus against the first elastic apparatus, so that the radio frequency test cable is disconnected from the first test apparatus.

Figure 8:
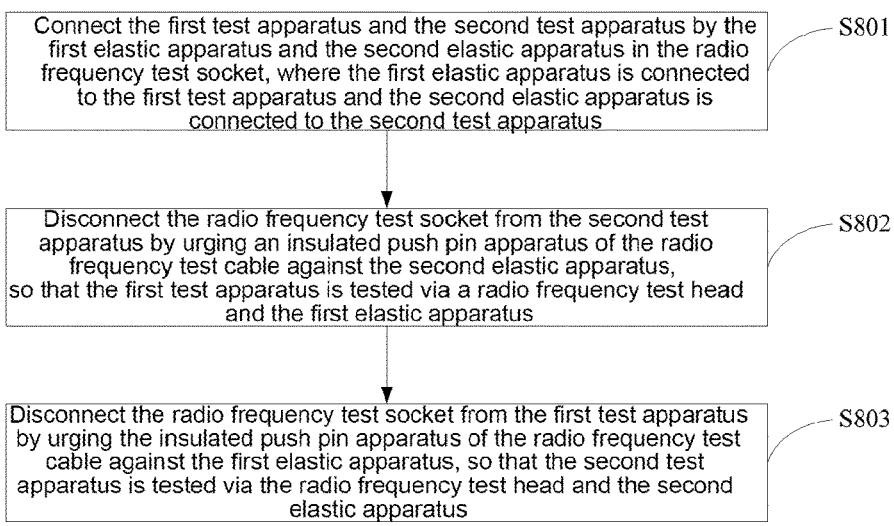
FIG. 8 is a flow diagram showing a method for mobile phone radio frequency test provided by embodiments of the present disclosure.

FIG. 8 is a flow diagram showing a method for mobile phone radio frequency test provided by embodiments of the present disclosure. As shown in FIG. 8, the method includes the following steps:

S801: the first test apparatus and the second test apparatus are connected via the first elastic apparatus and the second elastic apparatus in the radio frequency test socket, where the first elastic apparatus is connected to the first test apparatus and the second elastic apparatus is connected to the second test apparatus;

S802: the radio frequency test socket is disconnected from the second test apparatus by urging the insulated push pin apparatus of the radio frequency test cable against the second elastic apparatus, so that the first test apparatus is tested by the radio frequency test plug of the radio frequency test cable and the first elastic apparatus;

S803: the radio frequency test socket is disconnected from the first test apparatus by urging the insulated push pin apparatus of the radio frequency test cable against the first elastic apparatus, so that the second test apparatus is tested by the radio frequency test head and the second elastic apparatus.

Figure 9:
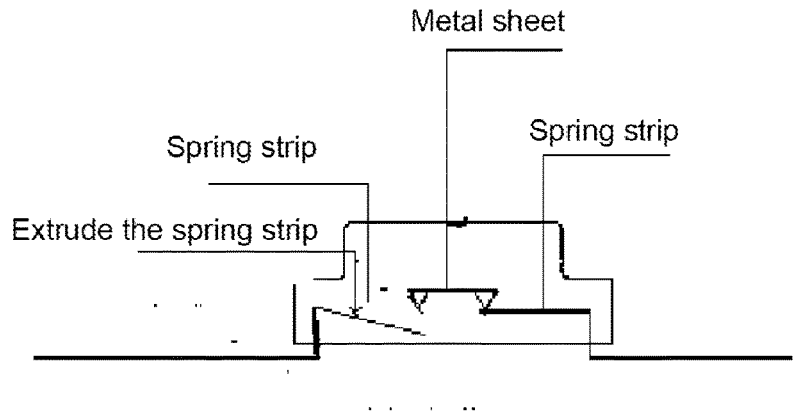
FIG. 9 is a schematic diagram when a test is performed by a radio frequency test socket provided by embodiments of the present disclosure.

FIG. 9 is a schematic diagram when a test is performed by a radio frequency test socket provided by embodiments of the present disclosure. As shown in FIG. 9, a spring strip on one side is disconnected from a middle metal sheet when extruded by a rigid plastic push pin, thus a signal in this path is disconnected, while a signal in another path is conducted with the radio frequency test cable.

Figure 10:
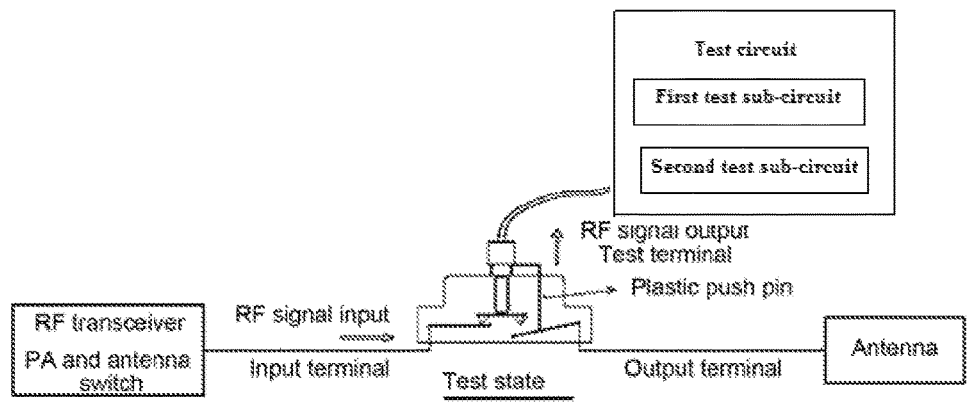
FIG. 10 is a schematic diagram of testing power and sensitivity of the radio frequency cable provided by embodiments of the present disclosure.

FIG. 10 is a schematic diagram of testing power and sensitivity of the radio frequency cable provided by embodiments of the present disclosure. As shown in FIG. 10, the radio frequency test cable is inserted into the radio frequency test socket according to a first direction, so that the radio frequency test plug of the radio frequency test cable is contacted with the metal sheet of the radio frequency test socket, and the insulated push pin of the radio frequency test cable is urged against a second spring strip of the radio frequency test socket downward. Through contacting the radio frequency test plug with the metal sheet and downward urging the insulated push pin against the second spring strip, the radio frequency test socket is disconnected from an antenna of the mobile phone, and the radio frequency test cable is connected to a radio frequency transceiver via the first spring strip, so as to test the radio frequency transceiver. That is to say, the second spring strip, in the radio frequency test socket, connected to the antenna of the mobile phone is extruded, and the second spring strip is disconnected from the metal sheet in the radio frequency test socket, so that the radio frequency test cable is connected to the radio frequency transceiver via the first spring strip to test the radio frequency transceiver.

Figure 11:
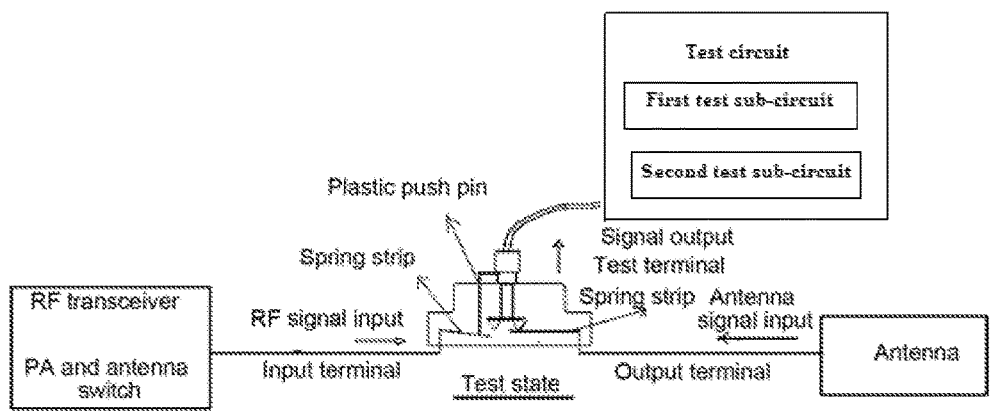
FIG. 11 is a schematic diagram of testing a passive waveform of an antenna of the mobile phone provided by embodiments of the present disclosure.

FIG. 11 is a schematic diagram of testing a passive waveform of an antenna of the mobile phone provided by embodiments of the present disclosure. As shown in FIG. 11, the radio frequency test cable is inserted into the radio frequency test socket according to a second direction, so that the radio frequency test plug of the radio frequency test cable is contacted with the metal sheet of the radio frequency test socket, and the insulated push pin of the radio frequency test cable is urged against the first spring strip of the radio frequency test socket downward. Though contacting the radio frequency test plug with the metal sheet and urging the insulated push pin against the first spring strip downward, the radio frequency test socket is disconnected from the radio frequency transceiver, and the radio frequency test cable is connected to the antenna of the mobile phone via the second spring strip, so as to test the antenna of the mobile phone. That is to say, the first spring strip, in the radio frequency test socket, connected to the radio frequency transceiver is extruded, and the first spring strip is disconnected from the metal sheet in the radio frequency test socket, so that the radio frequency test cable is connected to the antenna of the mobile phone via the second spring strip to test the S11 and the Smith circle diagram of the antenna of the mobile phone.

Moreover, according to the embodiments of the present disclosure, the two states in FIG. 10 and FIG. 11 can be realized merely by changing the direction of the radio frequency test cable.

In conclusion, the embodiments of the present disclosure have the following technical effects:

according to the embodiments of the present disclosure, through the novel radio frequency test socket and the matched radio frequency test cable, an antenna passive board and a radio frequency active board can be unified, and the antenna jig can be manufactured without damaging the mainboard.

Although the present disclosure is described above in details, the present disclosure is not limited herein. Those skilled in the art may carry out various modifications according to principles of the present disclosure. Therefore, the modifications made according to the principles of the present disclosure should be understood to be in the protection scope of the present disclosure.

INDUSTRIAL APPLICABILITY

As mentioned above, the radio frequency test socket and radio frequency test cable provided by the embodiments of the present disclosure have the following beneficial effects: according to the embodiments of the present disclosure, through the radio frequency test socket and the radio frequency test cable, the first test unit and the second test unit can be unified, the antenna jig can be manufactured without damaging the mainboard, and the user experience is improved.

What is claimed is:

1. A device for mobile phone radio frequency test, comprising:
    a radio frequency test socket, wherein the radio frequency test socket comprises: a radio frequency test base; a connection apparatus fixed in the radio frequency test base; and a first elastic apparatus and a second elastic apparatus, wherein the first elastic apparatus and the second elastic apparatus are fixed in the radio frequency test base, and elastically connected to the connection apparatus respectively;
    a radio frequency test cable, wherein the radio frequency test cable comprises: a radio frequency test plug fixed at an end of the radio frequency test cable; and an insulated push pin apparatus which is installed on a side of the radio frequency test plug and is longer than the radio frequency test plug; and
    a test circuit, configured to test, through the radio frequency test cable and the radio frequency test socket, a first test apparatus and a second test apparatus respectively, wherein the first test apparatus and the second test apparatus are connected to the first elastic apparatus and the second elastic apparatus in the radio frequency test socket respectively,
    wherein the test circuit comprises a first test sub-circuit configured to disconnect the radio frequency test cable from the second test apparatus by urging the insulated push pin apparatus against the second elastic apparatus, and utilize a connection between the radio frequency test plug and the connecting apparatus, so as to test the first test apparatus connected to the first elastic apparatus.

2. The device according to claim 1, wherein the test circuit further comprises a second test sub-circuit configured to disconnect the radio frequency test cable from the first test apparatus by urging the insulated push pin apparatus against the first elastic apparatus, and utilize a connection between the radio frequency test plug and the connection apparatus, so as to test the second test apparatus connected to the second elastic apparatus.

3. The device according to claim 1, wherein an elastic connection between the second elastic apparatus and the second contact point of the connection apparatus is disconnected when urging the insulated push pin apparatus against the second elastic apparatus, so that the radio frequency test cable is disconnected from the second test apparatus.

4. The device according to claim 2, wherein an elastic connection between the first elastic apparatus and the first contact point of the connection apparatus is disconnected when urging the insulated push pin apparatus against the first elastic apparatus, so that the radio frequency test cable is disconnected from the first test apparatus.

5. A method for mobile phone radio frequency test, comprising the following steps:
  connecting a first test apparatus to a second test apparatus via a first elastic apparatus in a radio frequency test socket and a second elastic apparatus in the radio frequency test socket, wherein the first elastic apparatus is connected to the first test apparatus and the second elastic apparatus is connected to the second test apparatus;
  disconnecting the radio frequency test socket from the second test apparatus by urging an insulated push pin apparatus of a radio frequency test cable against the second elastic apparatus, and connecting a radio frequency test plug of the radio test cable to a connection apparatus in the radio frequency test socket so that the first test apparatus is tested via the radio frequency test plug and the first elastic apparatus, wherein the connection apparatus is elastically connected to the first elastic apparatus and the second elastic apparatus; and
  disconnecting the radio frequency test socket from the first test apparatus by urging the insulated push pin apparatus of the radio frequency test cable against the first elastic apparatus, and connecting the radio frequency test plug to the connection apparatus so that the second test apparatus is tested via the radio frequency test plug and the second elastic apparatus.

6. The device for mobile phone radio frequency test according to claim 1, wherein the connection apparatus comprises: a metal sheet; a first contact point and a second contact point which are provided at two ends of a lower side of the metal sheet respectively.

7. The device for mobile phone radio frequency test according to claim 6, wherein the first elastic apparatus is elastically connected to the first contact point of the connection apparatus, and the second elastic apparatus is elastically connected to the second contact point of the connection apparatus.

* * * * *